United States Patent
Falcou et al.

(10) Patent No.: US 8,044,217 B2
(45) Date of Patent: Oct. 25, 2011

(54) WHITE-EMITTING COPOLYMERS, REPRESENTATION, AND USE THEREOF

(75) Inventors: Aurelie Falcou, Frankfurt (DE); Arne Büsing, Frankfurt (DE); Susanne Heun, Bad Soden (DE); Jürgen Steiger, Frankfurt (DE); Anja Gerhard, Egelsbach (DE); Niels Schulte, Kelkheim (DE); Heinrich Becker, Eppstein-Niederjosbach (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 12/728,295

(22) Filed: Mar. 22, 2010

(65) Prior Publication Data

US 2010/0197875 A1 Aug. 5, 2010

Related U.S. Application Data

(62) Division of application No. 10/572,117, filed as application No. PCT/EP2004/010439 on Sep. 17, 2004, now Pat. No. 7,696,284.

(30) Foreign Application Priority Data

Sep. 20, 2003 (DE) .................................. 103 43 606

(51) Int. Cl.
C07D 331/02 (2006.01)
C07D 321/00 (2006.01)
C08G 73/00 (2006.01)
C08G 61/02 (2006.01)
C08G 61/10 (2006.01)
C08G 61/12 (2006.01)

(52) U.S. Cl. .............. 549/1; 549/29; 549/200; 549/429; 525/370; 525/535; 525/540; 528/373; 528/425

(58) Field of Classification Search ................ 549/1, 29, 549/200, 429; 525/370, 535, 540; 528/373, 528/425
See application file for complete search history.

(56) References Cited

U.S. PATENT DOCUMENTS

| | | | |
|---|---|---|---|
| 6,956,095 | B2 | 10/2005 | Treacher et al. |
| 6,994,893 | B2 | 2/2006 | Spreitzer et al. |
| 2004/0135131 | A1 | 7/2004 | Treacher et al. |
| 2004/0138455 | A1 | 7/2004 | Stossel et al. |
| 2004/0206939 | A1 | 10/2004 | Spreitzer et al. |
| 2005/0038223 | A1 | 2/2005 | Becker et al. |
| 2006/0058494 | A1 | 3/2006 | Busing et al. |

FOREIGN PATENT DOCUMENTS

| | | |
|---|---|---|
| DE | 103 37 077 | 3/2005 |
| DE | 103 37 346 | 3/2005 |

(Continued)

OTHER PUBLICATIONS

Berkovich et al; Adjustable—ologomers; Nov. 1999; Elsevier Scienne S.A.; Chem Abstract 132: 108958.*

*Primary Examiner* — Duc Truong
(74) *Attorney, Agent, or Firm* — Connolly Bove Lodge & Hutz LLP

(57) ABSTRACT

The present invention relates to white-emitting copolymers which are obtained by a combination of blue-, green- and red-emitting repeating units. The copolymers of the invention display better film formation and an improved efficiency when used in polymeric organic light-emitting diodes compared to materials according to the prior art.

10 Claims, 1 Drawing Sheet

Electroluminescence spectrum of polymer P1 as a function of the brightness

FOREIGN PATENT DOCUMENTS

| | | |
|---|---|---|
| EP | 0 423 283 | 4/1991 |
| EP | 1 078 970 | 2/2001 |
| WO | WO-00/46321 | 8/2000 |
| WO | WO-02/068435 | 9/2002 |
| WO | WO-02/072714 | 9/2002 |
| WO | WO-02/077060 | 10/2002 |
| WO | WO-03/019694 | 3/2003 |
| WO | WO-03/020790 | 3/2003 |
| WO | WO-03/048225 | 6/2003 |
| WO | WO-2004/037887 | 5/2004 |

* cited by examiner

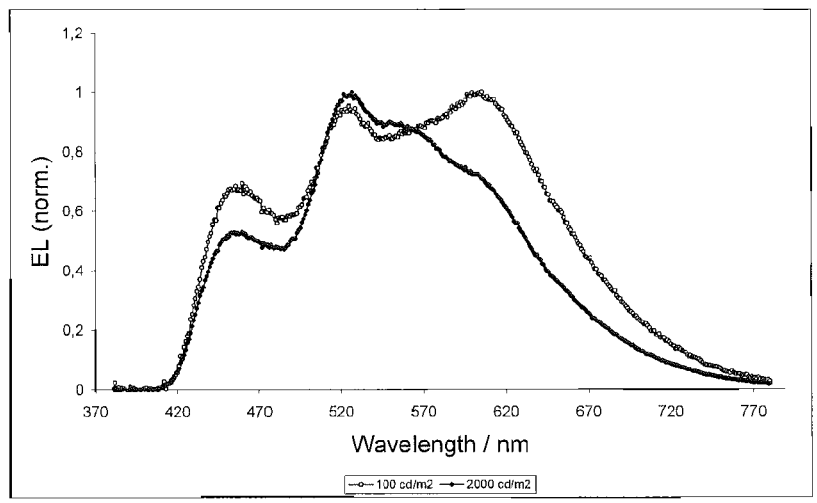
Figure 1: Electroluminescence spectrum of polymer P1 as a function of the brightness
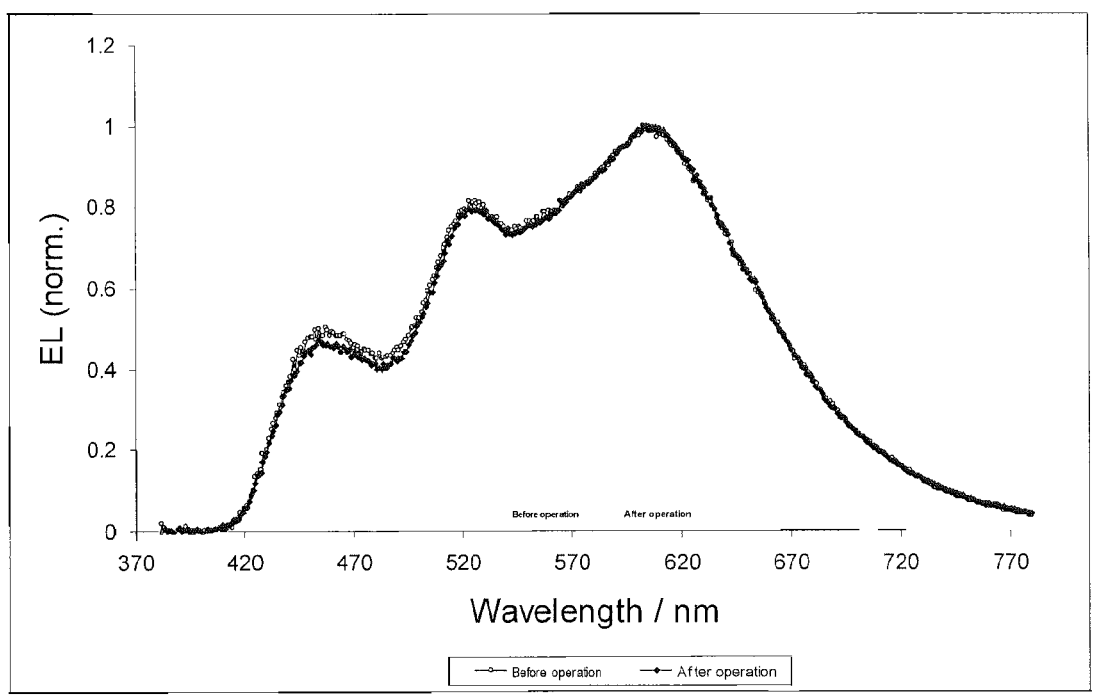
Figure 2: Electroluminescence spectrum of polymer P1 as a function of the time of operation

WHITE-EMITTING COPOLYMERS, REPRESENTATION, AND USE THEREOF

RELATED APPLICATIONS

This Application is a divisional application of U.S. patent application Ser. No. 10/572,117, filed on Mar. 16, 2006 now U.S. Pat. No. 7,696,284, which is incorporated by reference in its entirety for all useful purposes, which is a national stage application (under 35 U.S.C. §371) of International Application No. PCT/EP2004/010439, filed Sep. 17, 2004, which claims benefit of German Application No. 103 43 606.5, filed Sep. 20, 2003, all of which are incorporated herein by reference in their entirety for all useful purposes.

Wide-ranging research on the commercialization of display and lighting elements based on polymeric (organic) light-emitting diodes (PLEDs) has been carried out for about 12 years. This development was triggered by the fundamental developments disclosed in EP 423283. Recently, a first albeit simple product (a small display in a shaver from PHILIPS N.V.) has become available on the market. However, significant improvements are still necessary in order to make these displays genuinely competitive with the liquid crystal displays (LCDs) which currently dominate the market or to surpass them. In particular, it is necessary to provide either polymers for all emission colors (red, green, blue) which meet the requirements of the market (color saturation, efficiency, operating life, to name the most important) or to provide white-emitting polymers which meet these requirements and can be used in conjunction with color filters in full-color devices.

Various classes of materials have been developed as polymers. Thus, poly-para-phenylene-vinylenes (PPVs) are possible for this purpose. Furthermore, polyfluorene and polyspirobifluorene derivatives are another possibility, as are polymers comprising a combination of these two structural elements. In general, polymers comprising poly-para-phenylene (PPP) as structural element are possible for such use. Apart from the abovementioned classes, further possibilities are, for example, ladder PPPs (=LPPPs), polytetrahydropyrenes, polyindenofluorenes or polydihydrophenanthrenes.

To produce all three emission colors, it is necessary to polymerize particular comonomers into the corresponding polymers (cf., for example, WO 00/46321, WO 03/020790 and WO 02/077060). In this way, it is generally possible, starting from a blue-emitting base polymer ("backbone"), to produce the two other primary colors red and green.

The commercialization of both single-color and multicolor or full-color displays based on PLEDs is being assessed at present. Single-color electroluminescent devices can be produced comparatively simply by processing the materials by surface coating from solution (e.g. by spin coating, etc.). The structuring, i.e. the control of the individual pixels, is usually carried out here on the "leads", i.e. on the electrodes, for example. In the case of multicolor or full-color display elements, the use of printing methods (e.g. ink jet printing, offset printing, screen printing, etc.) is very probable. That this presents considerable problems is made obvious from the dimensions alone: structures in the region of a few 10 µm at layer thicknesses in the range from less than 100 nm to a few µm have to be produced.

A further possible way of producing full-color displays with simplification or avoidance of complicated printing techniques is to apply a white-emitting polymer over the entire surface or in a structured fashion and to generate the individual colors therefrom by means of a color filter, as is already prior art for liquid crystal displays (LCDs).

Furthermore, white-emitting polymers can be used for monochrome white displays. The use of white-emitting polymers as backlight in liquid crystal displays is also possible, both for monochrome displays and for multicolor displays. In the widest possible use, white emission is generally to be used for lighting purposes (illumination), since white is most similar to sunlight.

It can thus be seen that there is a great demand for white-emitting polymers. However, it is difficult or impossible to find a single chromophore which emits light over the entire visible range. Without wishing to be tied to a particular theory for the purposes of the invention, white cannot be assigned a particular wavelength or a particular wavelength range as is the case for red, green and blue. Only additive color mixing of, for example, emitted light having the primary colors red, green and blue or a mixture of complementary colors, for example blue and yellow, enables the total emitted light to appear white.

The best-known white-emitting polymer systems are therefore blends (mixtures) of a blue-emitting polymer and a small proportion of a yellow- to red-emitting polymeric or low molecular weight compound (e.g. U.S. Pat. No. 6,127, 693). Ternary blends in which green- and red-emitting polymers or low molecular weight compounds are mixed with the blue-emitting polymer are also known (e.g. Y. C. Kim et al., *Polymeric Materials Science and Engineering* 2002, 87, 286; T.-W. Lee et al., *Synth. Metals* 2001, 122, 437). A summary of such blends is given by S.-A. Chen et al., *ACS Symposium Series* 1999, 735 (Semiconducting Polymers), 163. US 2004/0033388 describes white-emitting blends comprising a blue-emitting polymer together with two or more low molecular weight emitters, with the dopants being used in amounts of less than 0.1% by weight. Here, extremely high voltages are necessary for such a system to be of use in practical applications.

All these blends, regardless of whether they are blends with polymers or low molecular weight compounds, have two critical disadvantages: the polymers in blends are often not ideally miscible with one another and therefore tend to give significantly poorer film formation and/or phase separation in the film. The formation of homogeneous films, as are essential for use in light-emitting diodes, is frequently not possible. In addition, there is a risk of crystallization or of migration of the low molecular weight compound, which leads to reduced long-term stability. Phase separation in the device during prolonged operation is also observed and leads to a reduction in the life and to color instabilities. In the case of white-emitting PLEDs, color purity and color stability of the device among the most important aspects. Here too, blends have a disadvantage, since the individual blend components age at different speeds ("differential aging") and thus lead to a color shift. Blends are therefore generally less suitable for use in PLEDs than are copolymers.

Furthermore, white-emitting copolymers whose white emission is made up of a blue-emitting unit in the polymer and an aggregate of these units whose emission is shifted in the red direction are also known. However, the efficiency of the emission when using such polymers is so low that such polymers are unusable in practical applications. An example of such a copolymer is given in US 2003/00081751; the white emission is in this case made up of the blue emission of a polymer backbone and the red-shifted emission of particular carbazole aggregates of which a large proportion is present in copolymerized form. Although this avoids the disadvantages inherent in the abovementioned blends, a cutoff voltage of 9 V and an efficiency of only 0.06 cd/A are reported for a device comprising such a polymer. However, the document does not teach how higher efficiencies and reduced cutoff and operating voltages can be achieved using the proposed polymer composition. A further example is given by K. L. Paik et al. (*Optical Materials* 2002, 21, 135). Here too, the red part of the emission is based on an aggregate (exciplex or the like). The disadvantage here can also clearly be seen, since the emission color is blue at voltages below 13 V and only shifts to white at voltages above 13 V. Zhan et al. (*Synth. Met.* 2001, 124, 323) studied a white-emitting copolymer comprising diethynylfluorene and thiophene units, with an exciplex also participating in the emission here. The external quantum efficiency is only 0.01% and electroluminescence can only be detected above a voltage of 11 V. A white-emitting copolymer comprising oxadiazole, phenylene-vinylene and alkyl ether units is described by Lee et al. (*Appl. Phys. Lett.* 2001, 79, 308) with the emission being composed of a blue emission of the polymer and a red emission of an excited dimer in this case, too. The maximum efficiency is only 0.071 cd/A, the operating voltages are very high and the light-emitting diode displays a high dependence of the color location on the voltage.

In view of the high voltages and the poor efficiencies of these polymers, we assume a disadvantage intrinsically associated with aggregate emission, namely that these act as charge traps. These polymers are all unsuitable for industrial use, since they do not display a stable white emission over a wide voltage range, and also display very poor efficiencies and require high voltages.

US 2003/224208 describes nonconjugated polymers which have triplet emitters bound in the side chain. It is mentioned that white emission can also be produced by use of a plurality of different metal complexes in a polymer. However, this document does not indicate which metal complexes can be usefully combined here and, in particular, the proportions in which these complexes have to be present in the polymer, so that a person skilled in the art would not be able to derive any teachings as to how white emission could be produced from these polymers on the basis of the information given. In particular, white-emitting polymers are only described as mixtures (blends) of two polymers having different emission colors in the examples, so that it is obvious that in this case white emission cannot be produced in a simple manner from a simple polymer.

EP 1424350 describes phosphorescent polymers which comprise blue, green and red triplet emitters or blue/green and yellow/red triplet emitters and can thus display an overall white emission. However, this document, too, does not indicate which metal complexes can be usefully employed here and the proportions in which they are to be used, so that in this case, too, it is not possible for a person skilled in the art to successfully use the polymers described for white emission in practice. In the single example of white-emitting polymers, only a very small proportion (1 mol %) of a blue-emitting monomer is used together with green- and red-emitting monomers in a nonconjugated matrix derived from carbazole. Although white emission is obtained using this polymer, neither efficiency nor operating voltage nor life are indicated, so that it has to be presumed that these properties are not yet satisfactory here and that such a small proportion of a blue-emitting monomer and a nonconjugated matrix derived from carbazole are therefore not suitable for achieving good properties.

WO 03/102109 describes white-emitting copolymers which simultaneously display phosphorescence from a covalently bound iridium complex and fluorescence from the conjugated main chain of the polymer. A proportion of the triplet emitter of preferably from 0.01 to 5 mol % is indicated here. However, all examples report polymers whose proportion of green-emitting triplet emitters is 1 mol % and more, usually even as high as 2-4 mol %, so that it may be presumed that the lower proportion is only referred to coincidentally. It is not stated how it is possible, in a targeted manner, to obtain polymers which display white luminescence instead of colored phosphorescence, which is likewise described in this patent application with the same proportion of the same monomers, so that once again a person skilled in the art is able to derive no teachings about the measures which have to be taken to prepare white-emitting polymers. Thus, examples which report very similar complexes in the same concentration in similar polymers, with some of these displaying green or red emission and in similar cases displaying white emission, are described. Furthermore, it is stated that the combination of fluorene units with red-emitting triplet emitters always leads to complete energy transfer and thus not to white emission. This suggests that it is not possible to obtain good white-emitting polymers in this way, since the proportion of red in the emission spectrum is too low if no red-emitting units can be used. Although the polymers described in the examples display white emission, the efficiency in the few examples in which electroluminescence measurements are described is extremely low and is in the range from <0.02 to 0.2 cd/A at operating voltages of about 12 V. These polymers are therefore unsuitable for practical applications.

It can clearly be seen from the above-described prior art that there is not yet a solution to the problem of obtaining high-quality, white-emitting PLEDs. For this reason, there continues to be a great need for white-emitting polymers which display good film formation, have high efficiencies and have low operating voltages.

It has now surprisingly been found that the copolymers described in more detail below display very efficient white emission at good color coordinates and a low operating voltage. These polymers and their use in PLEDs are therefore subject matter of the present invention.

BRIEF DESCRIPTION OF THE FIGURES

FIG. 1 shows the electroluminesence spectrum of polymer P1 as a function of the brightness.

FIG. 2 shows the electroluminescence spectrum of polymer P1 as a function of the time of operation.

The invention provides white-emitting copolymers comprising at least two different repeating units, characterized in that the first repeating unit, unit B, is present in a proportion of at least 10 mol % and displays blue emission and the second repeating unit, unit R, is present in a proportion of from 0.0005 to 1 mol % and displays red emission, with the proviso that this unit B is not a carbazole when the polymer is a nonconjugated phosphorescent polymer;

and with the exception of a polymer comprising the repeating units (a), (b) and (c),

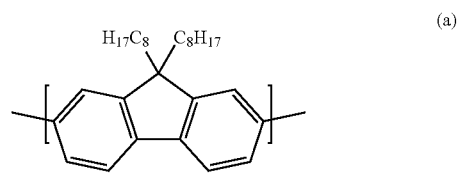

(a)

-continued

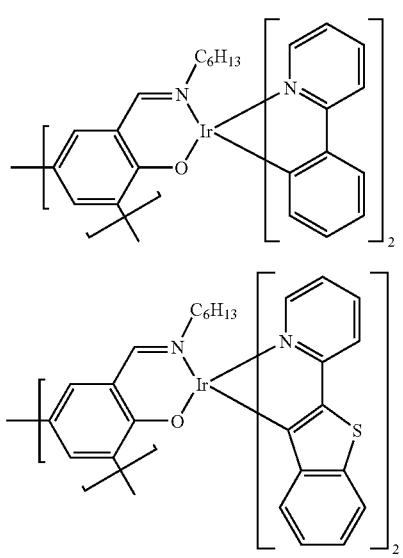

where the content of monomer (b) is in the range from 2.32 to 2.34 mol % and the content of monomer (c) is in the range from 0.174 to 0.176 mol %.

A preferred embodiment of the invention provides white-emitting copolymers comprising at least three different repeating units, characterized in that the first repeating unit, unit B, is present in a proportion of at least 10 mol % and displays blue emission, the second repeating unit, unit G, is present in the polymer in a proportion of from 0.001 to 3 mol % and displays green emission and the third repeating unit, unit R, is present in a proportion of from 0.0005 to 1 mol % and displays red emission.

This description does not rule out the possibility of a non-conjugated phosphorescent polymer comprising carbazole units when at least 10 mol % of units B which are different from carbazole are present.

In both the above-described copolymers, the proportions of all repeating units present, i.e. the units B, the units R, optionally the units G and optionally further repeating units, add up to 100 mol %.

White emission is defined by the CIE color coordinates x=0.33 and y=0.33 (chromaticity coordinates of the Commission Internationale de l'Eclairage of 1931). However, the color impression can display individual differences, so that a value which is in the vicinity of this range can still give the impression of white emission. For the purposes of the present invention, white emission is therefore an emission whose color coordinates lie within an ellipse going through the points having the x/y color coordinates of (0.22/0.24), (0.46/0.44), (0.28/0.38) and (0.37/0.28). The polymers of the invention preferably emit white light which is defined by a color location in the chromaticity diagram according to CIE 1931 in which the color coordinate x can assume values of from 0.28 to 0.38 and the color coordinate y can, independently of x, assume values of from 0.28 to 0.38.

A blue-emitting repeating unit B for the purposes of the present invention is defined as follows: a film of the homopolymer of this unit B displays luminescence (fluorescence or phosphorescence) and the maximum of the emission curve of a film of a polymer comprising 10 mol % of this unit B and 90 mol % of 2,7-[2',3',6',7'-tetra(2-methylbutyloxy) spirobifluoren]ylene is in a wavelength range from 400 to 490 nm.

A green-emitting repeating unit G for the purposes of the present invention is defined as follows: the maximum of the fluorescence or phosphorescence curve of a film of a polymer comprising 10 mol % of this unit G and 90 mol % of 2,7-[2',3',6',7'-tetra(2-methylbutyloxy)spirobifluoren]ylene is in a wavelength range from 490 to 570 nm.

A red-emitting repeating unit R for the purposes of the present invention is defined as follows: the maximum of the fluorescence or phosphorescence curve of a film of a polymer comprising 10 mol % of this unit R and 90 mol % of 2,7-[2',3',6',7'-tetra(2-methylbutyloxy)spirobifluoren]ylene is in a wavelength range from 570 to 700 nm.

It may here be explicitly pointed out that for the purposes of the present invention mixed colors such as yellow or orange also count as red or green emission depending on their emission maximum.

The limits within which a polymer displays white emission are not to be regarded as rigid. For example, it is possible for a polymer which comprises blue-emitting units together with from 0.0005 to 1 mol % of green units whose emission maximum according to the above definition is in the range from about 550 to 570 nm to still display white emission having good color coordinates. Such polymers are also subject matter of the present invention.

Preference is given to copolymers in which the proportion of red repeating units R is less than the proportion of green repeating units G. The ratio of red repeating units to green repeating units (units R:G) is particularly preferably in the range from 1:50 to 1:1.1. The ratio of red repeating units to green repeating units (units R:G) is very particularly preferably in the range from 1:20 to 1:2.

The polymers of the invention can be conjugated, partially conjugated or nonconjugated. A preferred embodiment of the invention uses conjugated or partially conjugated copolymers. A particularly preferred embodiment of the invention uses conjugated copolymers.

For the purposes of the present invention, conjugated polymers are polymers which have mainly $sp^2$-hybridized (or sp-hybridized) carbon atoms, which may also be replaced by appropriate heteroatoms, in the main chain. In the simplest case, this means the alternating presence of double and single bonds in the main chain. "Mainly" means that naturally occurring defects which lead to interruptions to the conjugation do not invalidate the term "conjugated polymer". Furthermore, polymers having, for example, arylamine units, arylphosphine units and/or particular heterocycles (i.e. conjugation via N-, O- or S atoms) and/or organic metal complexes (i.e. conjugation via the metal atom) in the main chain are likewise referred to as conjugated in the present patent application text. On the other hand, units such as simple (thio)ether bridges, alkylene bridges, ester, amide or imide linkages would clearly be defined as nonconjugated segments. For the purposes of the present invention, a partially conjugated polymer is a polymer which either has relatively long conjugated sections which are interrupted by nonconjugated sections in the main chain or has relatively long conjugated sections in the side chains of a polymer whose main chain is nonconjugated.

The different repeating units of the copolymer can be selected from various groups. These structural units and their syntheses are comprehensively described in WO 02/077060, WO 03/020790, DE 10337346.2 and the literature cited therein.

Blue-emitting repeating units B are typically units which are generally used as polymer backbone or units which are used as blue emitters. These are generally ones which comprise at least one aromatic or other conjugated structure but do not shift the emission color into the green or into the red. Preference is given to aromatic structures having from 4 to 40 carbon atoms, but also stilbene and tolane derivatives and certain bis(styryl)arylene derivatives. These are, for example, the following structural elements which may be substituted, for example by one or more groups having from 1 to 40 carbon atoms, or unsubstituted: 1,4-phenylene derivatives, 1,4-naphthylene derivatives, 1,4- or 9,10-anthracenylene derivatives, 2,7- or 3,6-phenanthrenylene derivatives, 4,4'-biphenylylene derivatives, 4,4''-terphenylylene derivatives, 4,4'-bi-1,1'-naphthylylene derivatives, 4,4'-stilbene derivatives, 4,5-dihydropyrene derivatives, 4,5,9,10-tetrahydropyrene derivatives, fluorene derivatives (e.g. as described in EP 0842208, WO 99/54385, WO 00/22027, WO 00/22026, WO 00/46321), spirobifluorene derivatives (e.g. as described in EP 0707020, EP 0894107, WO 03/020790, WO 02/077060), 5,7-dihydrodibenzoxepin derivatives, cis- and trans-indenofluorene derivatives (e.g. as described in WO 04/041901, EP 03014042.0) and 9,10-dihydrophenanthrene derivatives (e.g. as described in DE 10337346.2). Apart from these classes, ladder PPPs (=LPPPs) or sections of such polymers (e.g. as described in WO 92/18552) and also PPPs containing ansa structures (e.g. as described in EP 690086), for example, are also possible here. Bis(Styryl)arylene derivatives which are not electron-rich can also be used for this purpose. It can also be preferred to use a plurality of different blue-emitting repeating units B of this type instead of one such unit in a polymer.

If the polymer contains green-emitting repeating units G, these are preferably units which comprise at least one aromatic or other conjugated structure and shift the emission color into the green. Preferred structures for green-emitting repeating units G are selected from the group consisting of electron-rich bisstyrylarylenes and derivatives of these structures. Without wishing to be tied to a particular theory, we presume that electron-pushing substituents generally lead to a green shift in the emission of these units. Further preferred green-emitting repeating units are selected from the group consisting of benzothiadiazoles and corresponding oxygen derivatives, quinoxalines, phenothiazines, phenoxazines, dihydrophenazines, bis(thienyl)arylenes, oligo(thienylenes) and phenazines. It is also permissible for a plurality of different green-emitting repeating units G to be used instead of one such repeating unit, in which case the total proportion of the green-emitting repeating units G is then not more than 3 mol %.

Particularly preferred structures which are suitable as green-emitting repeating units G are structures of the formulae (I) to (XII), which may be substituted, for example by one or more organic groups having from 1 to 40 carbon atoms, or unsubstituted,

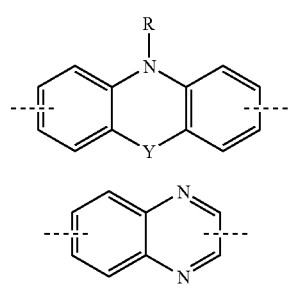

Formel (I)

Formel (II)

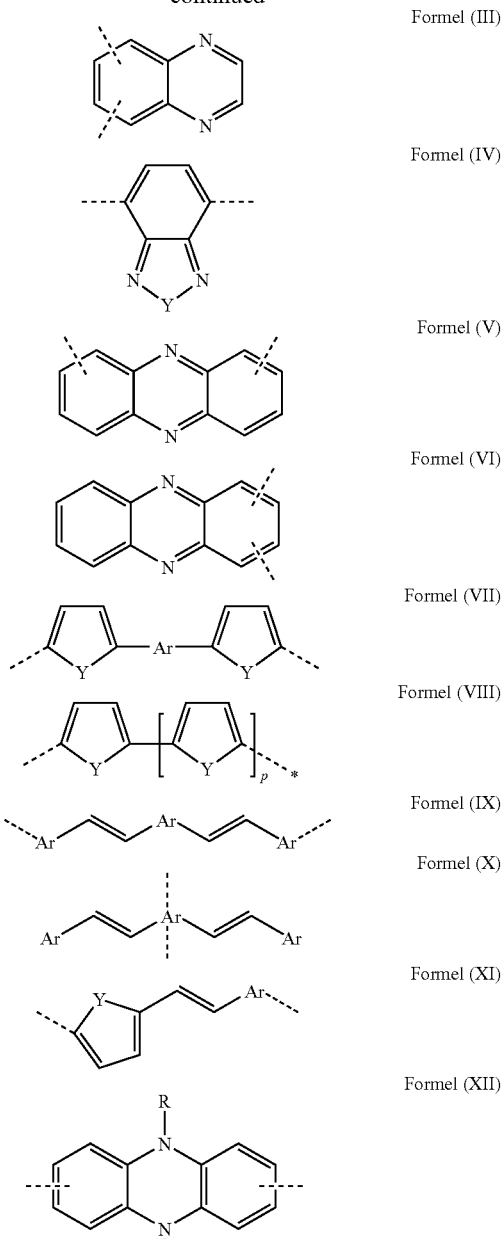

NOTE TO CHECKER: 'Formel' -> 'Formula', CH where the symbols and indices used have the following meanings:

Y is identical or different on each occurrence and is in each case S or O;

Ar is identical or different on each occurrence and is in each case an aromatic or heteroaromatic ring system which has from 3 to 30 carbon atoms and may be unsubstituted or substituted by fluorine or by one or more substituents R, OR or NR$_2$, preferably selected from the group consisting of phenyls, biphenyls, fluorenes, spirobifluorenes, thiophenes, furans or pyrroles, with the proviso that at least one unit Ar in the formulae (IX) and (X) is an electron-rich aromatic unit or is substituted by electron-rich substituents; this is preferably achieved by the unit being selected from among the structures of substituted or unsubstituted thiophenes, furans or pyrroles or by this unit being a phenyl group which is substituted by at least one alkoxy group, aryloxy group or substituted or unsubstituted amino group or a plurality of identical or different groups of this type;

R is identical or different on each occurrence and is in each case H, a linear, branched or cyclic alkyl chain which has from 1 to 22 carbon atoms and in which one or more nonadjacent carbon atoms may also be replaced by O, S, —CO—O— or —O—CO—O—, where one or more H atoms may also be replaced by fluorine, or a substituted or unsubstituted aryl group which has from 5 to 40 carbon atoms and in which one or more carbon atoms may also be replaced by O, S or N;

p is identical or different on each occurrence and is in each case 1, 2, 3, 4 or 5, preferably 1, 2 or 3;

and the broken-line bonds indicate the linkage in the polymer; they are in this case not a methyl group.

As red-emitting repeating units R, preference is given to units which comprise at least one aromatic or other conjugated structure and shift the emission color into the red. Preferred structures for red-emitting repeating units R are those in which electron-rich units, for example thiophene, are combined with green-emitting electron-deficient units, for example quinoxaline or benzothiadiazole. Further preferred red-emitting repeating units R are systems comprising at least four, preferably at least five, fused, substituted or unsubstituted aromatic units such as rubrenes, pentacenes or perylenes which are preferably substituted, or conjugated push-pull systems (systems which are substituted by donor and acceptor substituents) or systems such as squarines or quinacridones which are preferably substituted. Here, it is also permissible for a plurality of different red-emitting repeating units R to be used instead of one such repeating unit, with the total number of the red-emitting repeating units R then being not more than 1 mol %.

Particularly preferred structures which are suitable as red-emitting repeating units R are structures of the formulae (XIII) to (XX), which may be substituted, for example by one or more organic groups having from 1 to 40 carbon atoms, or unsubstituted,

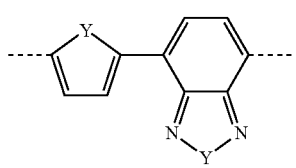

Formel (XIII)

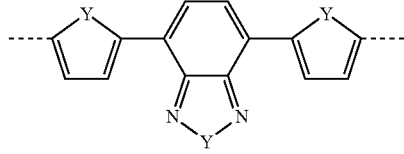

Formel (XIV)

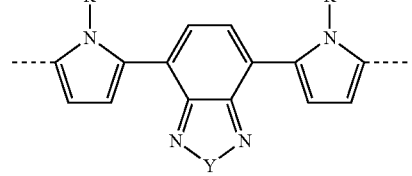

Formel (XV)

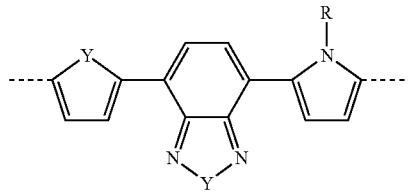

Formel (XVI)

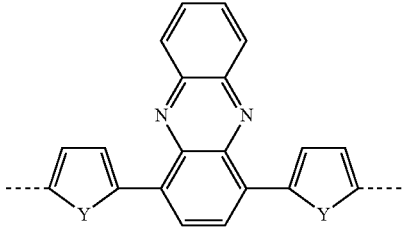

Formel (XVII)

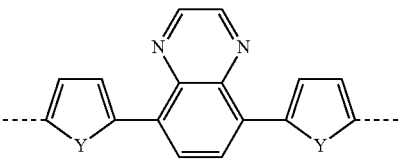

Formel (XVIII)

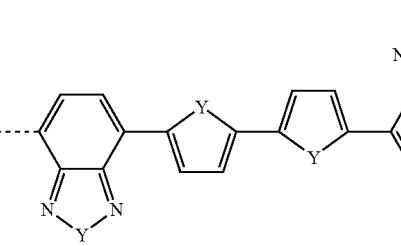

Formula (XIX)

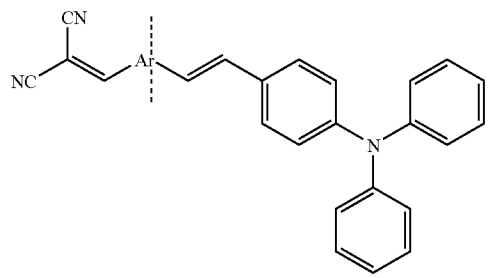

Formula (XX)

where the symbols are as defined above.

As blue-, green- and red-emitting structural units B, G and R, it is in principle also possible to use units which emit light from the triplet state, i.e. display electrophosphorescence instead of electrofluorescence, which frequently leads to an increase in the energy efficiency, instead of or in addition to the abovementioned units. These units will hereinafter be referred to as triplet emitters. The use of such metal complexes in low molecular weight OLEDs is described, for example, in M. A. Baldo et al. (Appl. Phys. Lett. 1999, 75, 4-6). Compounds suitable here are firstly compounds which contain heavy atoms, i.e. atoms from the Periodic Table of the Elements having an atomic number of more than 36. Compounds comprising d and f transition metals which fulfill the abovementioned condition are particularly useful for this purpose. Very particular preference is given to structural units of this type which contain elements of groups 8 to 10 (i.e. Ru, Os, Rh, Ir, Pd, Pt), in particular Ir or Pt. Possible structural units for the polymers of the invention are various complexes which are described, for example, in the patent applications WO 02/068435, WO 02/081488, EP 1239526 and WO 04/026886. Corresponding monomers which can, for example, be copolymerized by means of Suzuki coupling are described in WO 02/068435.

The colors of the complexes are determined first and foremost by the metal used, by the precise ligand structure and by the substituents on the ligand. Green- and also red- and blue-emitting complexes are all known. Thus, for example, unsubstituted tris(phenylpyridyl)iridium(III) emits green light, while electron-pushing substituents in the para position relative to the coordinating carbon atom (e.g. diarylamino substituents) shift the emission into the orange-red. Furthermore, derivatives of this complex which have a modified ligand structure and lead to orange or deep red emission are known. Examples of such ligands are 2-phenylisoquinoline, 2-benzothienylpyridine and 2-naphthylpyridine. Blue-emitting complexes are obtained, for example, by substituting the tris (phenylpyridyl)iridium(III) skeleton with electron-pulling substituents, for example a plurality of fluoro and/or cyano groups.

If, for example, triplet emitters are thus used as red-emitting units and units which emit light from the singlet state are used as green- and blue-emitting units, the overall polymer thus displays a mixture of electrofluorescence and electrophosphorescence and can display white emission if the composition is appropriate. If only triplet emitters are used for all emission colors, the polymer displays only electrophosphorescence. If only singlet emitters are used for all emission colors, the polymer displays only electrofluorescence.

Preference is also given to white-emitting copolymers which comprise further repeating units which either display no fluorescence or whose maximum of the fluorescence curve is in a wavelength range from 400 to 490 nm in addition to the abovementioned repeating units.

The use of such repeating units can be useful, for example, to aid hole transport, hole injection, electron transport and/or electron injection. For the purposes of the present patent application text, such structural elements are as follows: if homopolymers or oligomers of these structural elements were produced, these would have, at least for one charge carrier, i.e. either for electrons or holes, a higher charge carrier mobility than is the case for a polymer which consists exclusively of structural elements described above as "blue-emitting" or backbone structures. The charge carrier mobility (measured in $cm^2/(V \cdot s)$) is preferably greater by a factor of at least 10, particularly preferably at least 50.

Repeating units which improve hole transport and/or hole injection are preferably selected from the group consisting of triarylamine derivatives, triarylphosphine derivatives, benzidine derivatives, tetraarylene-para-phenylenediamine derivatives, thianthrene derivatives, dibenzo-p-dioxin derivatives, phenoxathiin derivatives, carbazole derivatives, azulene derivatives, thiophene derivatives, pyrrole derivatives, furan derivatives and further O-, S- or N-containing heterocycles having a high HOMO (HOMO=highest occupied molecular orbital); these may each be substituted, for example by one or more organic groups having from 1 to 40 carbon atoms, or unsubstituted. These units preferably lead to a HOMO in the polymer of less than 5.8 eV (relative to vacuum), particularly preferably less than 5.5 eV.

Structural elements which improve electron transport and/or electron injection are preferably selected from the group consisting of pyridine derivatives, pyrimidine derivatives, pyridazine derivatives, pyrazine derivatives, triarylboranes, oxadiazole derivatives, quinoline derivatives, triazine derivatives and further O-, S- or N-containing heterocycles having a low LUMO (LUMO=lowest unoccupied molecular orbital); these may be substituted, for example by one or more organic groups having from 1 to 40 carbon atoms, or unsubstituted. These units preferably lead to a LUMO in the polymer of greater than 2.7 eV (relative to vacuum), particularly preferably greater than 3.0 eV.

Further structural elements can be used to aid singlet-triplet transfer in the polymer. Such groups are used, in particular, when at least one of the red-, green- and/or blue-emitting structural units comprises a triplet emitter. Groups preferred for this purpose are carbazole units, in particular bridged carbazole dimer units as described in the unpublished patent applications DE 10304819.7 and DE 10328627.6.

It has surprisingly been found that stable white emission is achieved particularly well when using an unexpectedly small proportion of green- and red-emitting repeating units G and R. Thus, the proportion of blue-emitting repeating units B is preferably at least 20 mol %, the proportion of green-emitting repeating units G is preferably up to a maximum of 2 mol %, the proportion of red-emitting repeating units R is preferably from 0.0005 to 0.5 mol % and the ratio of red-emitting repeating units to green-emitting repeating units (units R:G) is preferably in the range from 1:50 to 1:1.1.

Particular preference is given to the proportion of blue-emitting repeating units B being at least 30 mol %, the proportion of green-emitting repeating units G being from 0.005 to 1 mol %, the proportion of red-emitting repeating units R being from 0.001 to 0.3 mol % and the ratio of red-emitting repeating units to green-emitting repeating units (units R:G) preferably being in the range from 1:30 to 1:1.5.

Very particular preference is given to the proportion of blue-emitting repeating units B being at least 50 mol %, the proportion of green-emitting repeating units G being from 0.01 to 0.5 mol %, the proportion of red-emitting repeating units R being from 0.002 to 0.1 mol %, in particular from 0.002 to 0.05 mol %, and the ratio of red-emitting repeating units to green-emitting repeating units (units R:G) preferably being in the range from 1:20 to 1:2.

It can also be preferred that the proportion of blue-emitting repeating units B in the polymer is up to 99 mol % or more. Without wishing to be tied to a specific theory, we presume that the surprisingly good partial energy transfer from blue to green and from green to red and the consequently surprisingly low proportion of red- and green-emitting units in the conjugated polymers results from a high conjugation along the polymer chain. In polymer blends, the proportions of the red-emitting polymer (and, if present, the green-emitting polymer) are frequently significantly higher.

The polymers of the invention generally have from 10 to 10000, preferably from 50 to 5000, particularly preferably from 50 to 2000, repeating units.

The copolymers of the invention can have random or block structures or can have a plurality of these structures arranged alternately. The way in which copolymers having block structures can be obtained is, for example, comprehensively described in the unpublished patent application DE 10337077.3. It is also possible to incorporate particular units, for example red- and/or green-emitting units, as end group at the ends of the polymer chain. The use of various structural elements enables properties such as solubility, solid state morphology, color, charge injection properties and charge transport properties, electrooptical characteristics, etc., to be set.

The polymers of the invention are generally prepared by polymerization of the monomers. The type of polymerization reaction is not critical. However, some types which will lead to formation of C—C bonds have been found to be particularly useful, in particular for conjugated polymers:
(A) polymerization by the SUZUKI method,
(B) polymerization by the YAMAMOTO method,
(C) polymerization by the STILLE method.

The way in which the polymerization can be carried out by means of these methods and the way in which the polymers can be separated off from the reaction medium and purified are described in detail in, for example, WO 04/037887. The synthesis of partially conjugated or nonconjugated polymers can also be carried out by these methods, by using appropriate monomers which are not completely conjugated. However, other synthetic methods as are generally well-known from polymer chemistry, for example polycondensations or polymerizations in general which proceed, for example, via reaction of alkenes and lead to polyethylene derivatives in the broadest sense which then have the chromophores bound in the side chains, are also possible for partially conjugated or nonconjugated polymers.

Compared to the abovementioned white-emitting polymer blends and the above-mentioned white-emitting copolymers, the copolymers of the invention have the following surprising advantages:
(1) The copolymers of the invention form significantly more homogeneous films compared to polymer blends of the prior art. No phase separation can be observed in them and they are therefore also more long-lived in use. They are therefore better suited for use in PLEDs.
(2) The copolymers of the invention have significantly higher luminous efficiencies and significantly lower operating voltages in use, in particular compared to polymers whose white emission is based on aggregates. However, the efficiency is also greater by a factor of up to more than 50 compared to polymers which simultaneously display fluorescence and phosphorescence, as described, for example, in WO 03/102109, and in which the proportion of the green emitter is significantly higher than in the polymers of the invention. This is of tremendous importance since it makes it possible, firstly, to achieve the same brightness at a lower energy consumption, which is of particular importance in mobile applications (displays for mobile telephones, PDAs, etc.) which rely on batteries and accumulators. Conversely, higher brightnesses are obtained at the same energy consumption, which is of interest for, for example, lighting applications.
(3) The ability to obtain pure white emission in the case of the copolymers of the invention is at least the same or better than the prior art. In particular, in the case of the copolymers of the invention, the color point is shifted only slightly as a function of the operating voltage or as a function of the time of operation, which was in no way to be expected and is therefore surprising. This is essential for the use of these copolymers.
(4) The efficiency remains virtually constant even at high voltages and thus high brightnesses, as a result of which these polymers are also suitable for use in display elements having passive matrix control.

It can also be preferred to use the polymers of the invention not as a pure substance but as a mixture (blend) together with any further polymeric, oligomeric, dendritic or low molecular weight substances. These can, for example, improve charge transport and/or the charge equilibrium or influence the transfer from the singlet state to the triplet state or emit themselves. Thus, for example, it can be preferred to mix green-emitting compounds into a polymer comprising blue- and red-emitting units in order to increase the green component in the spectrum. However, electronically inactive substances can also be useful for influencing, for example, the morphology of the polymer film formed or the viscosity of polymer solutions. Such blends are therefore also subject matter of the present invention.

The invention further provides solutions and formulations comprising one or more copolymers or blends according to the invention in one or more solvents. The way in which polymer solutions can be prepared is described, for example, in WO 02/072714, WO 03/019694 and the literature cited therein. These solutions can be used for producing thin polymer layers, for example by surface coating methods (e.g. spin coating) or by printing methods (e.g. ink jet printing, screen printing, etc.).

The copolymers and blends according to the invention can be used in PLEDs. The way in which PLEDs can be produced is described comprehensively as a general process in WO 04/037887. This has to be adapted appropriately for the individual case. As stated above, the polymers of the invention are very particularly suitable as electroluminescence materials in the PLEDs or displays produced in this way.

For the purposes of the invention, electroluminescence materials are materials which can be used as active layer in a PLED. The term "active layer" means that the layer is capable of emitting light on application of an electric field (light-emitting layer) and/or that it improves the injection and/or transport of positive and/or negative charges (charge injection layer or charge transport layer).

The invention therefore also provides for the use of a copolymer or blend according to the invention in a PLED, in particular as electroluminescence material. The copolymers of the invention are preferably used in the emitting layer.

The invention thus likewise provides a PLED having one or more active layers of which at least one comprises one or more polymers or blends according to the invention. The active layer can, for example, be a light-emitting layer and/or a charge transport layer and/or a charge injection layer, preferably a light-emitting layer.

One embodiment of the invention provides for the use of a PLED according to the invention in a monochrome white-emitting display.

A further embodiment of the invention provides for the use of a PLED according to the invention in a monochrome color, multicolor or full-color display in which the color is produced by use of a color filter on the white-emitting PLED.

A further embodiment of the invention provides for the use of a PLED according to the invention for lighting purposes.

A further embodiment of the invention provides for the use of a PLED according to the invention as backlight in a liquid crystal display (LCD).

Thus, the invention further provides white-emitting displays comprising a PLED according to the invention, color, multicolor or full-color displays using a color filter on a PLED according to the invention, lighting elements comprising a PLED according to the invention and liquid crystal displays comprising a PLED according to the invention as backlight.

The present patent application text and also the examples below are directed at the use of polymers or blends according to the invention in PLEDs and the corresponding displays. The present invention can also be readily applied without a further inventive step to, for example, white-emitting dendrimers or oligomers. Likewise, a person skilled in the art will be able, without having to make an inventive step, to utilize the polymers or blends according to the invention for further uses in other electronic devices, e.g. for organic solar cells (O-SCs), organic laser diodes (O lasers), organic integrated circuits (O-ICs), in organic field effect transistors (O-FETs)

or in organic thin film transistors (O-TFTs), to name only a few applications. The use of the polymers or blends according to the invention in the corresponding devices and also the devices themselves are likewise subject matter of the present invention.

The present invention is illustrated by the following examples without being restricted thereto. A person skilled in the art will be able to prepare further organic semiconductors according to the invention and use these in organic electronic devices on the basis of the information given in the description and the examples presented without having to make a further inventive step.

EXAMPLES

Example 1

Monomer Syntheses

The structures of the monomers used for the polymers according to the invention are depicted below. Their emission color in the polymer (in accordance with the definition in the description) is likewise noted. The syntheses are described in WO 03/020790 and DE 10337346.2.

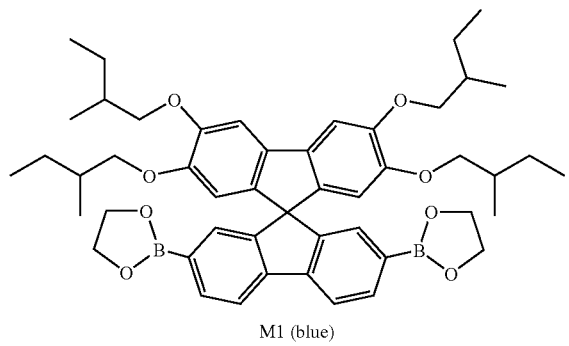

M1 (blue)

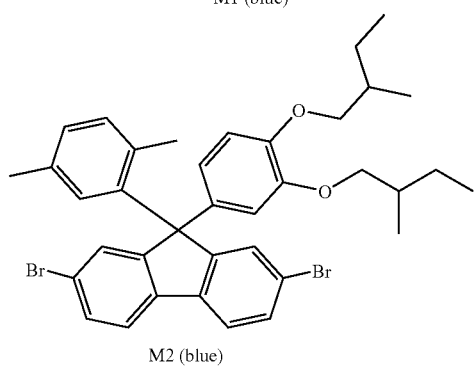

M2 (blue)

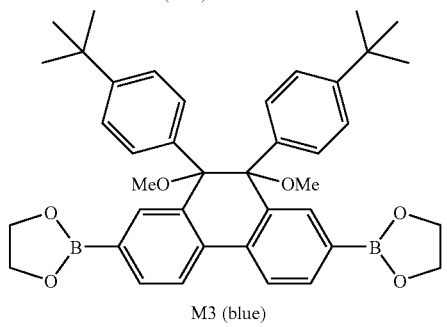

M3 (blue)

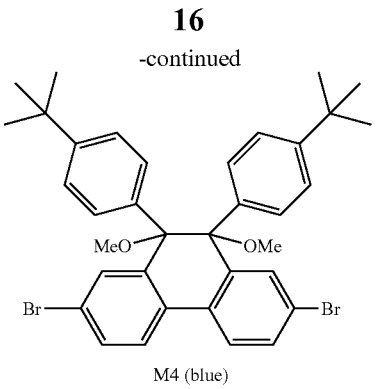

M4 (blue)

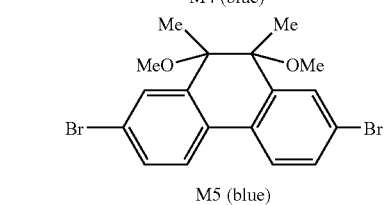

M5 (blue)

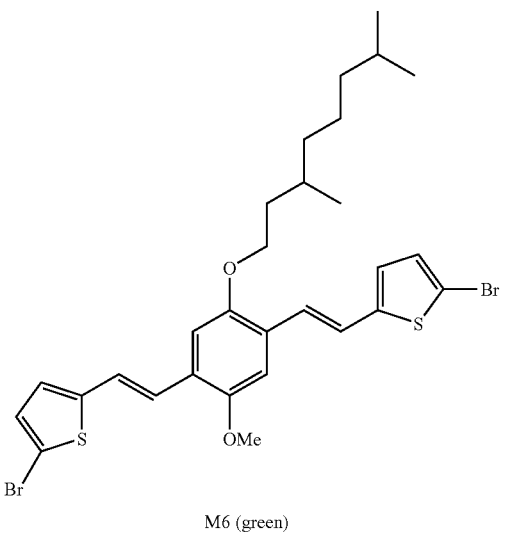

M6 (green)

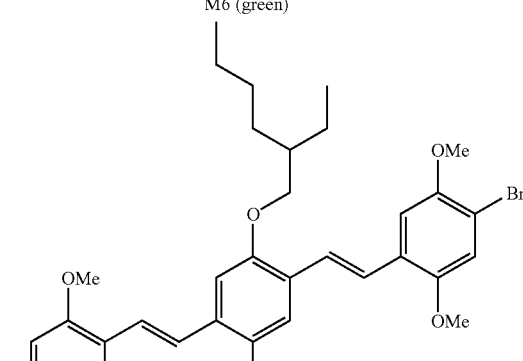

M7 (green)

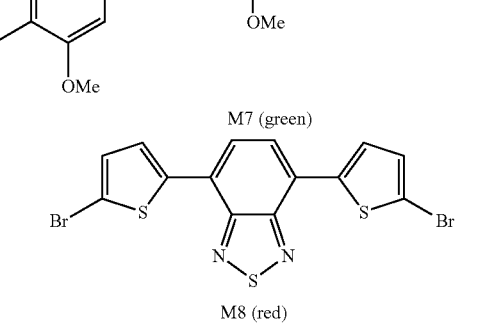

M8 (red)

-continued

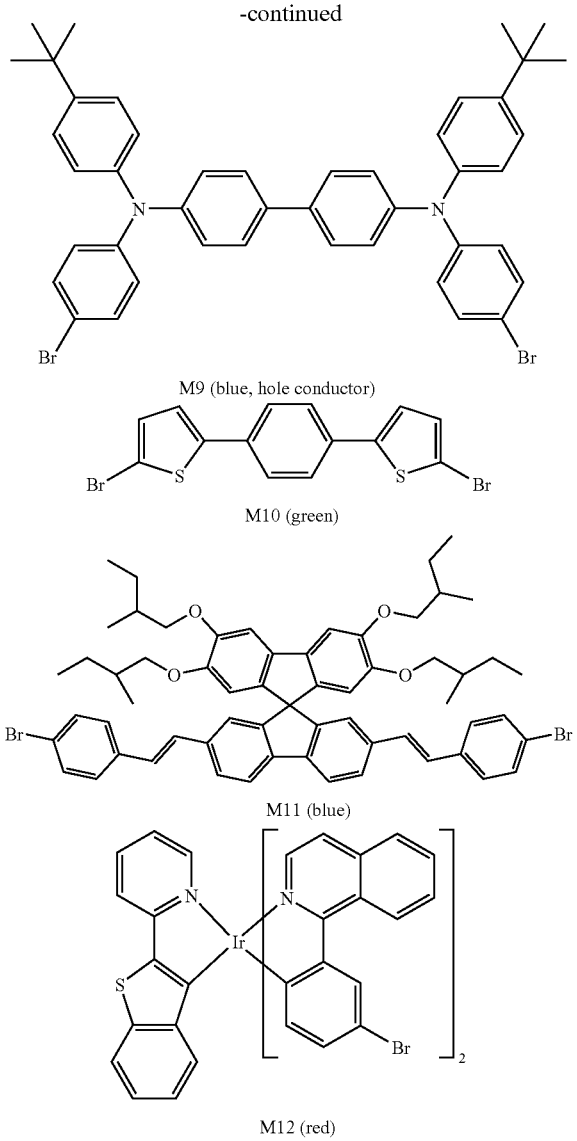

M9 (blue, hole conductor)

M10 (green)

M11 (blue)

M12 (red)

Example 2

Polymer Syntheses

The polymers were synthesized by SUZUKI coupling as described in WO 03/048225. The composition of the polymers P1 to P9 synthesized (Examples 4 to 12) is summarized in Table 1.

Example 3

Production of the PLEDs

All polymers were examined for use in PLEDs. The PLEDs were in each case two-layer systems, i.e. substrate// ITO//PEDOT//polymer//cathode. PEDOT is a polythiophene derivative (from H. C. Starck, Goslar). Ba/Ag (from Aldrich) was used as cathode in all cases. The way in which PLEDs can be produced has been comprehensively described in WO 04/037887 and the literature cited therein.

The most important device properties of the polymers according to the invention (color, efficiency, operating voltage, life) are shown in Table 1.

As can easily be seen from this data, the efficiency of all the polymers according to the invention is a number of times the efficiency of the copolymers according to the prior art, and the operating voltages are also significantly lower. Thus, for example, an efficiency of 0.06 cd/A is reported for the copolymer in US 2003/00081751, from which it can be seen that the copolymers according to the invention surpass the prior art by a factor of up to more than 100. A cutoff voltage of 9 V is reported for this polymer according to the prior art, while the polymers according to the invention generally have voltages in the order of only 4-5 V at 100 cd/m². The efficiency is likewise a number of times as high as that of polymers according to the prior art which contain a significantly higher proportion of a green-phosphorescing emitter (WO 03/102109) and display an overall white emission.

TABLE 1

Examples 4 to 12: Properties of various white-emitting copolymers P1 to P9 according to the invention.

| | | Proportion of monomers in the polymerization [mol %] | | | | | | | | | GPC[a] | | Electroluminescence | | | |
|---|---|---|---|---|---|---|---|---|---|---|---|---|---|---|---|---|
| | | | | | | | | | | Further | | | Max. Eff.[b] | U[c] | CIE | |
| Ex. | Poly. | M1 | M2 | M3 | M4 | M5 | M6 | M7 | M8 | M9 | monomer | $M_w$ | $M_n$ | [cd/A] | [V] | coordinates[d] | Life[e] [h] |
| 4 | P1 | 50 | 39.88 | | | | 0.1 | | 0.02 | 10 | | 672 | 225 | 7.89 | 4.4 | 0.37/0.39 | 1100 |
| 5 | P2 | 50 | 39.88 | | | | | 0.1 | 0.02 | 10 | | 853 | 125 | 6.50 | 4.2 | 0.32/0.32 | 450 |
| 6 | P3 | | | 50 | 39.88 | | 0.1 | | 0.02 | 10 | | 95 | 37 | 5.20 | 5.6 | 0.36/0.38 | 450 |
| 7 | P4 | 50 | | | | 39.88 | 0.1 | | 0.02 | 10 | | 317 | 101 | 8.25 | 4.2 | 0.40/0.41 | 2500 |
| 8 | P5 | 50 | 29.98 | | | | | | 0.02 | 10 | 10 M11 | 501 | 152 | 5.02 | 4.3 | 0.31/0.32 | 750 |
| 9 | P6 | 50 | 29.94 | | | | 0.05 | | 0.01 | 10 | 10 M11 | 762 | 108 | 7.85 | 4.1 | 0.37/0.42 | 1400 |
| 10 | P7 | 50 | 39.88 | | | | | | 0.02 | 10 | 0.1 M10 | 983 | 201 | 4.69 | 4.5 | 0.30/0.27 | n.d. |
| 11 | P8 | 50 | 39.88 | | | | 0.1 | | | 10 | 0.02 M12 | 283 | 105 | 7.16 | 4.0 | 0.32/0.44 | 1600 |
| 12 | P9 | 50 | 29.88 | | | | 0.1 | | 0.02 | 10 | 10 M11 | 624 | 146 | 8.06 | 3.9 | 0.43/0.44 | 10 000 |

[a]GPC measurements: THF; 1 ml/min, PIgel 10 μm Mixed-B 2 × 300 × 7.5 mm², 35° C., RI detection calibrated against polystyrene; FIG. reported in kDa.
[b]Max. Eff.: Maximum efficiency, measured in cd/A.
[c]Voltage at a brightness of 100 cd/m².
[d]CIE coordinates: Color coordinates of the Commission Internationale de l'Eclairage 1931.

TABLE 1-continued

Examples 4 to 12: Properties of various white-emitting copolymers P1 to P9 according to the invention.

| | Proportion of monomers in the polymerization [mol %] | | | | | | | | | GPC[a] | | Electroluminescence | | | |
|---|---|---|---|---|---|---|---|---|---|---|---|---|---|---|---|
| | | | | | | | | | Further | | | Max. Eff.[b] | U[c] | CIE | |
| Ex. Poly. | M1 | M2 | M3 | M4 | M5 | M6 | M7 | M8 | M9 monomer | $M_w$ | $M_n$ | [cd/A] | [V] | coordinates[d] | Life[e] [h] |

[e]Life: Time for the brightness to drop to 50% of the initial brightness (extrapolated to an initial brightness of 100 cd/m²).

Example 13

Dependence of the Emission Color on the Brightness

For polymer P1 (Example 4), the emission color was measured as a function of the brightness at two different brightnesses (100 cd/m² and 2000 cd/m²). For practical use, it is important that the color changes only little as a function of the brightness. The electroluminescence spectra obtained are shown in FIG. 1:

It can be seen that although the emission in the red region of the spectrum decreases somewhat at higher brightness, this color shift is small (change in the color coordinates from x/y 0.37/0.39 at 100 cd/m² to x/y 0.35/0.42 at 2000 cd/m²). This color shift can be tolerated, and the polymer can be regarded as mostly color constant as a function of the brightness or the operating voltage. This is a significant advantage compared to copolymers according to the prior art. Thus, for example, K. L. Paik et al., *Optical Materials* 2002, 21, 135, describes a polymer which displays white emission at voltages above 13 V (which is in itself unusable in practical applications), while below this voltage the emission color is blue, so that there is an extreme dependence of the emission color on the operating voltage (and thus also on the brightness).

Example 14

Emission Color as a Function of the Time of Operation

For polymer P1 (Example 4), the emission color was determined as a function of the time of operation. For this purpose, the electroluminescence spectrum of a freshly constructed PLED was measured. The PLED was then operated at a constant current density (10 mA/cm²) until the brightness had dropped to 50% of the initial brightness, and the electroluminescence spectrum was measured again. The two spectra are shown in FIG. 2:

It can be seen that the spectrum is virtually unchanged as a function of the time of operation (change in the x/y color coordinates from 0.37/0.39 before operation to 0.38/0.40 after operation), so that the emission color is constant over the time of operation. This is a further essential aspect for practical use of the polymer. Here too, the polymers according to the invention offer a decisive advantage over polymers and in particular blends according to the prior art. Blends in particular are known for the individual blend components aging at different rates during operation ("differential aging"), so that the color often shifts considerably during the time of operation. Such blends are therefore not usable for practical applications. Thus, for example, a white-emitting blend comprising a blue polymer (comprising 50 mol % of M1, 37.5 mol % of M2 and 12.5 mol % of M9) into which 0.4% of an orange PPV (polyphenylene-vinylene) have been mixed displays initial x/y color coordinates of 0.29/0.37. After operation of the PLED, this color shifts to the color coordinates 0.36/0.45. Such a color shift cannot be tolerated in practical use.

The invention claimed is:

1. A monomer of the formula (XI)

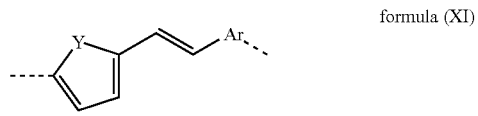

formula (XI)

wherein Y is identical or different on each occurrence and is in each case S or O;

Ar is identical or different on each occurrence and is in each case phenylene and may be unsubstituted or substituted by fluorine or by one or more radicals R, OR or NR₂;

R is identical or different on each occurrence and is in each case H, a linear, branched or cyclic alkyl chain which has from 1 to 22 carbon atoms and in which one or more nonadjacent carbon atoms is optionally replaced by O, S, —CO—O— or —O—CO—O—, where one or more H atoms may also be replaced by fluorine, or a substituted or unsubstituted aryl group which has from 5 to 40 carbon atoms and in which one or more carbon atoms is optionally replaced by O, S or N, and the broken-line bonds indicate the linkage in the polymer.

2. A polymer comprising one or more monomers as claimed in claim 1.

3. An electroluminescent material comprising the polymer as claimed in claim 2.

4. An electronic component or device comprising the polymer as claimed in claim 2.

5. The electronic component or device as claimed in claim 4, wherein the component or device is an OLED, PLED, OIC, OFET, OSC or O-laser.

6. A monomer of the formula (XI)

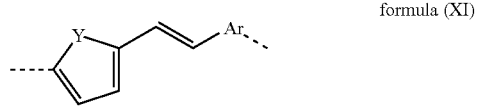

formula (XI)

wherein Y is identical or different on each occurrence and is in each case S or O;

Ar is identical or different on each occurrence and is in each case an aromatic-ring system which has from 3 to 30 carbon atoms—and may be unsubstituted or substituted by fluorine or by one or more radicals R, OR or NR₂;

R is identical or different on each occurrence and is in each case H, a linear, branched or cyclic alkyl chain which has from 1 to 22 carbon atoms and in which one or more nonadjacent carbon atoms is optionally replaced by O, S, —CO—O— or —O—CO—O—, where one or more H atoms may also be replaced by fluorine, or a substituted or unsubstituted aryl group which has from 5 to 40 carbon atoms and in which one or more carbon atoms is optionally replaced by O, S or N, and the broken-line bonds indicate the linkage in the polymer.

7. A polymer comprising one or more monomers as claimed in claim 6.

8. An electroluminescent material comprising the polymer as claimed in claim 7.

9. An electronic component or device comprising the polymer as claimed in claim 7.

10. The electronic component or device as claimed in claim 9, wherein the component or device is an OLED, PLED, OIC, OFET, OSC or O-laser.

* * * * *